United States Patent [19]
Ohmi et al.

[11] Patent Number: 6,001,727
[45] Date of Patent: Dec. 14, 1999

[54] METHOD OF MAKING A SEMICONDUCTOR DEVICE

[75] Inventors: Tadahiro Ohmi, Sendai; Mamoru Miyawaki, Isehara, both of Japan

[73] Assignee: Canon Kabushiki Kaisha, Tokyo, Japan

[21] Appl. No.: 08/827,464

[22] Filed: Mar. 28, 1997

[30] Foreign Application Priority Data

Apr. 1, 1996 [JP] Japan ................................ 8-079052

[51] Int. Cl.$^6$ ............................................ H01L 21/4763
[52] U.S. Cl. ..................... 438/618; 438/660; 438/687; 438/688; 438/618
[58] Field of Search .................. 438/660, 687, 438/688, 618

[56] References Cited

U.S. PATENT DOCUMENTS

| | | | |
|---|---|---|---|
| 4,328,261 | 5/1982 | Heinecke et al. | 438/688 |
| 5,154,949 | 10/1992 | Shindo et al. | 427/253 |
| 5,169,803 | 12/1992 | Miyakawa | 438/688 |
| 5,179,042 | 1/1993 | Mikoshiba et al. | 437/187 |
| 5,196,372 | 3/1993 | Mikoshiba et al. | 437/187 |
| 5,208,187 | 5/1993 | Tsubouchi et al. | 437/194 |
| 5,218,238 | 6/1993 | Yuzurihara et al. | 257/754 |
| 5,232,871 | 8/1993 | Ho | 438/660 |
| 5,232,872 | 8/1993 | Ohba | 438/687 |
| 5,240,559 | 8/1993 | Ishida | 438/687 |
| 5,283,206 | 2/1994 | Sugano | 438/660 |
| 5,300,307 | 4/1994 | Frear et al. | 438/660 |
| 5,308,794 | 5/1994 | Tu | 438/660 |
| 5,494,860 | 2/1996 | McDevitt et al. | 438/660 |
| 5,512,515 | 4/1996 | Takeuchi et al. | 438/688 |
| 5,527,739 | 6/1996 | Parrillo et al. | 438/687 |
| 5,541,444 | 7/1996 | Ohmi et al. | 257/587 |
| 5,602,424 | 2/1997 | Tsubouchi et al. | 257/771 |
| 5,612,230 | 3/1997 | Yuzurihara et al. | 437/21 |
| 5,633,199 | 5/1997 | Fiordalice et al. | 438/660 |
| 5,851,917 | 12/1998 | Lee | 438/627 |

*Primary Examiner*—John F. Niebling
*Assistant Examiner*—Lynne A. Gurley
*Attorney, Agent, or Firm*—Fitzpatrick, Cella, Harper & Scinto

[57] ABSTRACT

In a semiconductor device in which a wiring layer is formed on the surface of a layer having a stepped portion, the wiring layer formed contains hydrogen at least at its surface portion. In a process for fabricating the semiconductor device, hydrogen is incorporated in the wiring layer in the course of, or after, the formation of the wiring layer. In particular, the wiring is heated at a temperature of from 150° C. to 450° C. in an atmosphere containing hydrogen gas, radical hydrogen or plasma hydrogen, without the step of exposure to the atmosphere, in the course of, or after, the formation of the wiring layer. The wiring layer is formed in an Ar and/or Xe plasma containing from 0.1% to 10% of at least one of hydrogen, radical hydrogen and plasma hydrogen.

21 Claims, 5 Drawing Sheets

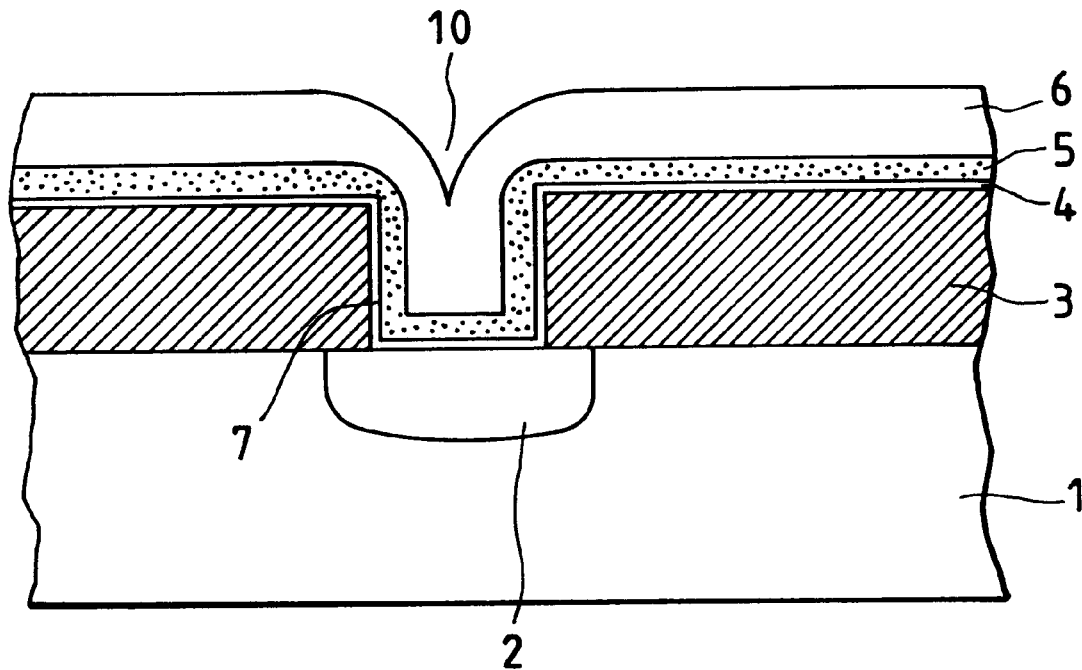

METHOD OF MAKING A SEMICONDUCTOR DEVICE

BACKGROUND OF THE INVENTION

1. Field of the Invention

This invention relates to a semiconductor device used in liquid-crystal display devices, microprocessors, dynamic RAMs and so forth, and to a process for its fabrication.

2. Related Background Art

Semiconductor devices are being made much more high-speed and highly-integrated with an increase in demand for making electronic products that have higher performances. Accordingly, wiring structures and their fabrication processes are required to satisfy the following demands.

(1) Low-resistant and stable ohmic contacts can be achieved even when contact holes or through holes are made finer than ever.

(2) Although contact holes, through holes, via holes and so forth have a stepped structure, any layers formed thereon should have a flat structure.

However, the above requirements cannot be met by using conventional methods, in which one forms wiring of an aluminum material such as Al—Si or Al—Si—Cu followed by patterning. For example, when a wiring material is deposited inside contact holes or through holes, voids 10 as shown in FIG. 8 or stepped portions may occur. Especially when the contact holes or the like have an aspect ratio of 1 or more, such voids may remarkably occur.

Accordingly, to meet the requirements (1) and (2), a technique employing CPM (chemical mechanical polishing) has been developed.

The CMP technique is one in which, e.g., a barrier metal such as titanium nitride (TiN) is thinly provided after contact holes or through holes have been formed by patterning, where tungsten (W) is further deposited on the barrier metal such as TiN by CVD (chemical vapor deposition) so that the contact holes or via holes are filled with W, followed by CMP to smooth the surface, and thereafter Al type or Cu type wiring is formed to make patterning.

Such a technique can meet the above requirements (1) and (2). However, this method has the following problems.

(3) The insides of the contact holes or through holes are filled with the W metal and have a higher resistance than the metals such as Al or Cu, which cause an increase in resistance at the contact holes or through holes.

(4) Not do the deposition of W by CVD and the smoothing by CMP result in a high cost but these steps also require complicated procedure, and also it is difficult to remove particles (e.g., abrasive particles) in the step of CMP, which gives rise to a serious problem with lower yields, resulting in a higher total cost than conventional techniques.

Thus, these steps must be carried out in a simpler manner, and a good yield obtained.

SUMMARY OF THE INVENTION

An object of the present invention is to provide a semiconductor device and a process for its fabrication, that can achieve in a simpler manner and with a good yield a structure having a low resistance and a flatness even when the device originally has greatly stepped portions such as contact holes or through holes.

The semiconductor device of the present invention is one which contains at least hydrogen in its wiring material.

The process for fabricating the semiconductor device of the present invention, is one which contains at least hydrogen in the course of film formation, or after the film formation, for the wiring in a semiconductor device.

The present inventors have discovered that the incorporation of hydrogen in at least the surface of a wiring layer makes either voids or stepped portions occur much less frequently when the insides of contact holes or stepped portions are filled with the wiring material by deposition.

Since the voids or stepped portions may occur less, the film formation of tungsten conventionally required for the smoothing becomes unnecessary, which brings about the advantage that not only can one step be omitted but also the particles can be removed with ease in the step of CMP, resulting in a high level of yield.

In addition, the contacts can be formed using wiring materials with a low resistance and may have no problem when joined to different materials, bringing about the advantage that contacts having a low resistance can be achieved.

The hydrogen may be added either in the course of film formation for the wiring or after the film formation.

BRIEF DESCRIPTION OF THE DRAWINGS

FIG. 8 is a structural view of a semiconductor device.

DESCRIPTION OF THE PREFERRED EMBODIMENTS

Embodiments of the present invention will be described below with reference to the accompanying drawings. Without limitation to the following embodiments, the constituents may be replaced by some substituents or equivalents so long as the object of the present invention can be achieved.

Figure 1:
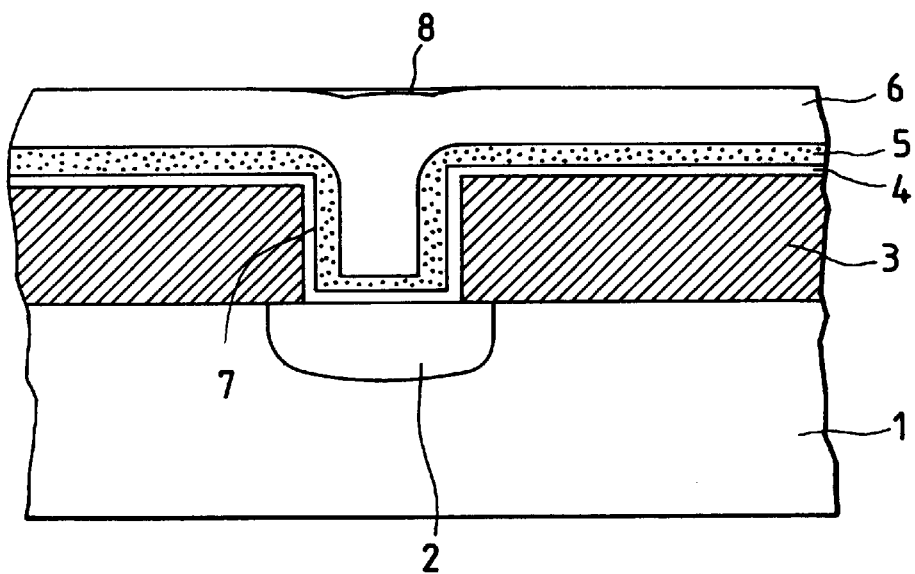
FIG. 1 is a structural view of a semiconductor device preferable for applying the present invention.

An example of a semiconductor device according to a preferred embodiment of the present invention is shown in FIG. 1. In the present specification, the semiconductor device includes liquid-crystal display devices and other all electronic devices having wiring.

FIG. 1 cross-sectionally illustrates a contact region in which a metal wiring is connected to a high-density impurity layer of Si or the like semiconductor substrate.

In FIG. 1, reference numeral 1 denotes a p-type well region provided on the Si substrate; 2, an $n^+$-type high-density impurity region provided in the p-type well region 1; 3, an insulating layer formed of BPSG (boron phosphorus doped glass) or the like; 4, a Ti thin film; 5, a TiN thin film incorporated with oxygen; 6, an AlSi wiring layer at least the surface portion of which is incorporated with hydrogen.

Needless to say, the wiring layer 6 is by no means limited to the use of AlSi, and the layer may also be effective when formed of Al, AlSiCu, AlGeCu, AlGe, Cu, CuGe or the like. In particular, a layer containing Ge is preferred.

Those other than the wiring layer 6 may be formed through conventional steps.

For example, the p-type well region 1 formed on the Si substrate surface is subjected to ion implantation to form the high-density n$^+$-type impurity region 2. Thereafter, the BPSG film 3 is formed in a thickness of about 700 nm, and the BPSG film 3 is reflowed at 900 to 1,000° C. to smooth its surface.

Thereafter, subsequent to resist coating and photolithography steps, contact holes of about 0.5 $\mu$m diameter are formed at contacts 7 by RIE (reactive ion etching). The contact holes may be in the form obtained not only by anisotropic dry etching but also by contact etching at the beginning of which holes are formed by round etching in an isotropic mode followed by etching in an anisotropic mode.

After the resist is stripped off, the surface is washed with diluted hydrofluoric acid and then rinsed with pure water containing low-dissolved oxygen, followed by drying. Subsequently, the Ti thin film is formed in a thickness of from about 5 to 50 nm, and then the TiN thin film is formed in a thickness of from 80 to 200 nm, using a film-forming apparatus (e.g., a sputtering film-forming apparatus). After the TiN thin film has been formed, the wafer thus processed is set open to the atmosphere to effect oxidation between columnar crystals of TiN. As a substitute means, in place of setting open to the atmosphere, the TiN thin film may be heated at 200 to 500° C. in an atmosphere of $N_2$, $N_2O$ or $O_2$.

The wafer thus processed is introduced into an ultra-high vacuum sputtering chamber, where the wiring layer containing hydrogen is formed.

As a method for forming a wiring layer containing hydrogen, the following two methods are preferable.

A first method that may be used is a method in which the wiring layer is, after it is formed by a conventional method, heated at a temperature of from 150 to 450° C. in an atmosphere containing hydrogen gas, radical hydrogen or plasma hydrogen.

A second method is a method in which the wiring layer is formed in an Ar and/or Xe plasma containing, e.g., from 0.1 to 10% of at least one of hydrogen, radical hydrogen and plasma hydrogen.

The first method and the second method, which may be carried out alternately, will be detailed below.

First Method

Figure 6:
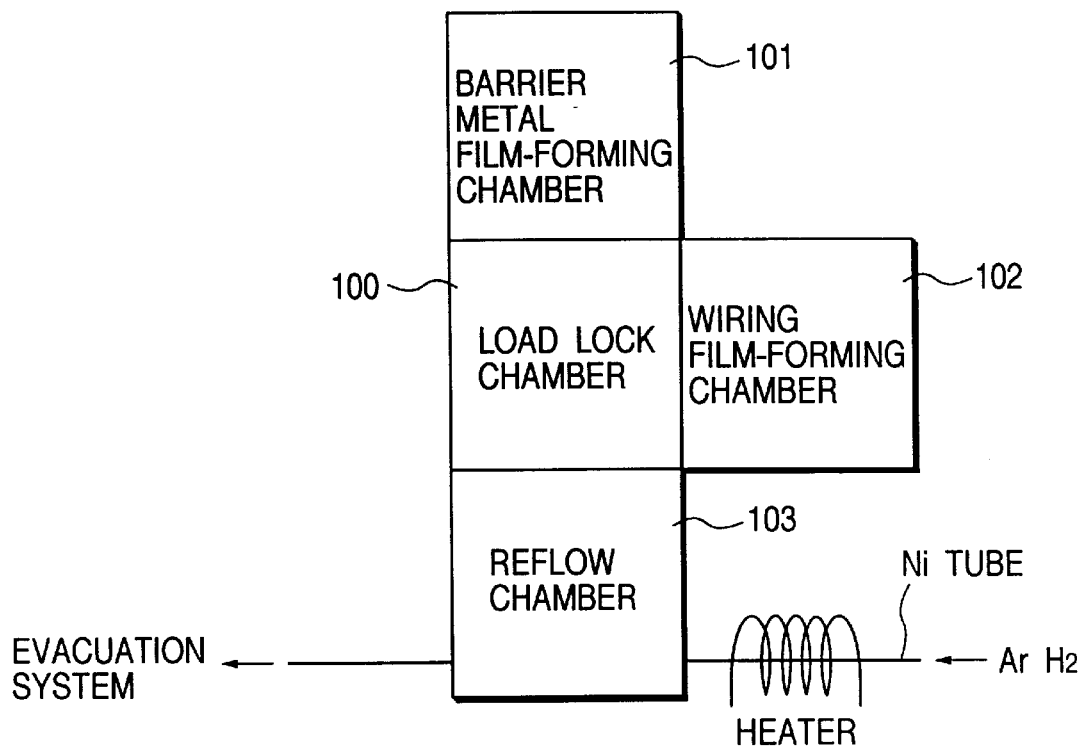
FIG. 6 is a block diagram showing an example of an apparatus used to carry out the process of the present invention.

First, an example of an apparatus for carrying out the first method is shown in FIG. 6. This apparatus is constituted of a barrier metal film-forming chamber 101 and in addition thereto a wiring film-forming chamber 102 and a reflow chamber 103 which are each connected through a load lock chamber 100 to make up a triple processing chamber system.

The wafer is first put into the load lock chamber 100, and the inside of the chamber is evacuated. At this stage, in order to prevent water content from adhering to the chamber surface of the load lock chamber 100, the inside of the load lock chamber 100 is kept at a positive pressure when the wafer is put in, and is evacuated while being purged with high-purity $N_2$. The side walls of the load lock chamber 100 may also preferably be heated to a high temperature so that the water content can be prevented from adhering.

A heating mechanism may preferably be provided at a susceptor portion of the load lock chamber 100 so that the water content can be removed from the wafer surface when it stands adhered to the surface.

The inside of the above load lock chamber 100 is evacuated to a vacuum state at a level of from $10^{-7}$ to $10^{-9}$ Torr. After its inside has reached this vacuum state, its gate valve is opened to put the wafer into the film-forming chamber 101, and then the gate valve is closed. In the wiring film-forming chamber 102, the TiN layer surface is cleaned by pre-sputtering and the wiring layer, e.g., an AlSi layer, is formed in an atmosphere of Ar in the chamber 102.

Needless to say, the target used when this film is formed is not limited only to AlSi, and Al, AlSiCu, AlGeCu, AlGe, Cu, CuGe or the like may also be used. In case other than pure Al and pure Cu, the Si, Cu or Ge may preferably be added at a level of from 0.2 to 5% by weight, and more preferably from 0.5 to 1% by weight. In particular, the incorporation of Ge is effective for making materials flowable.

The base pressure at the time of film formation is $10^{-11}$ to $10^{-8}$ Torr, providing an ultra-high vacuum state, where the formation of an oxide layer on the surface of the film formed may little take place.

When Cu is incorporated, a high electromigration breakdown strength can be achieved. When Ge is incorporated, the flowability of wiring materials can be improved, so that shapes of contact holes and through holes in a good step coverage can be obtained.

After the wiring layer has been formed, the gate valve is opened, where the wafer thus processed is moved to the reflow chamber 103 through the load lock chamber 100 and then heated at a temperature region of from 150 to 450° C. in an atmosphere of $Ar+H_2$, $N_2+H_2$, $H_2$, or 2H* (hydrogen radicals).

If it is heated at a temperature lower than 150° C., the wiring layer can be made less flowable. If it is heated at a temperature higher than 450° C., there is a possibility that Al may strike through the barrier metal to cause faulty contact, making it difficult to put the device into practical use. It may more preferably be heated at 200 to 400° C., and most preferably from 250 to 350° C.

This processing may preferably be carried out at a background pressure of $10^{-7}$ Torr or below. Hence, the evacuation may preferably be made using a turbo-molecular pump. Upon the heating of the wiring layer in the atmosphere containing $H_2$, radical hydrogen or plasma hydrogen, the hydrogen weakens the metallic bonding force in the wiring layer at its surface, so that, as denoted by reference numeral 8 in FIG. 1, the wiring material flows into the contact holes to provide a good flatness. In the apparatus shown in FIG. 6, hydrogen is flowed into the reflow chamber 103 through a nickel tube heated to 400 to 550° C., and hence the hydrogen radicals are generated inside the tube.

This processing is different from conventional reflowing in the following points.

1) The processing for the film formation up to the reflowing is carried out under an ultra-high vacuum, and hence the oxide layer formed on the surface can be very thinly reflowed with ease.

2) Because of the hydrogen atmosphere, electrons are deprived from the wiring layer, and hence the metallic bond of Al (or Cu and so forth) positive holes is weakened to bring about an improvement in flowability.

Thus, in such a wiring layer, a region having a higher hydrogen content is observed at least at its surface portion than in its interior. The flowability can be further improved when Ge is incorporated.

Second Method

Figure 7:
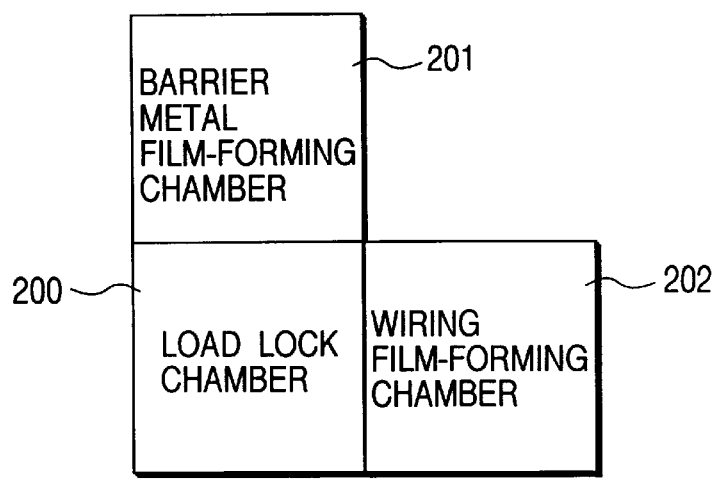
FIG. 7 is a block diagram showing an example of an apparatus used to carry out the process of the present invention.

An example of an apparatus for carrying out the second method is shown in FIG. 7. This apparatus is constituted of a barrier metal film-forming chamber 201 and in addition thereto a wiring film-forming chamber 202 which are each connected through a load lock chamber 100 to make up a double processing chamber system. The manner in which the wafer is put into the load lock chamber 200 and how to manage the inside of the load lock chamber 200 thereafter are the same as those described in the first method, and their description is not repeated.

The first, film-forming chamber 201 is a chamber for forming barrier metal Ti and TiN type films. These films may be formed in the same chamber, or, needless to say, two chambers may be prepared so that Ti and TiN are kept independent from each other.

The step of barrier metal film formation is also the same as that in the first step, and its description is not repeated.

The wafer is loaded in the chamber 202 for forming the film of a wiring metal, and sputtering is carried out in an atmosphere to which hydrogen has been added. As a gas used here, a gas obtained by adding 0.1 to 10% of $H_2$ to Ar may be discharged to make up a plasma atmosphere or a gas obtained by adding 0.1 to 10% of $H_2$ to Xe may be discharged to make up a plasma atmosphere, and films may preferably be formed in such an atmosphere.

Since the sputtering is carried out in an atmosphere containing hydrogen, not a cryopump but a turbo-molecular pump may preferably be used.

The film may also be formed while introducing 0.1 to 10% of hydrogen radicals into an Ar or Xe plasma atmosphere.

The Al bonding force at the surface becomes weak in the course of film formation, and hence Al can be flowed into the contact holes at the time of film formation, so that the wiring with well filled-up holes can be achieved.

In our experiment, the Al metal was seen to be little made flowable when hydrogen content was less than 0.1%. When it was more than 10%, the sputtering rate became lower, especially at the time of film formation, to cause a decrease in throughput in the film-forming apparatus. The flowability was improved when Ge was incorporated in the Al film by sputtering a target incorporating Ge.

Measurement by SIMS (secondary ion mass spectroscopy) revealed that a very small quantity of hydrogen was incorporated in the wiring layer formed by this method, which was formed in an atmosphere containing $H_2$. The incorporation of H also brought about an improvement in crystallizability, so that no hillocks occurred when heated at 300° C. in the atmosphere after the film formation.

This method enables both film formation and reflowing in the same process and can make the process simpler, bringing about a great improvement in yield and cost.

Multi-layer Wiring Structure

Figure 2:
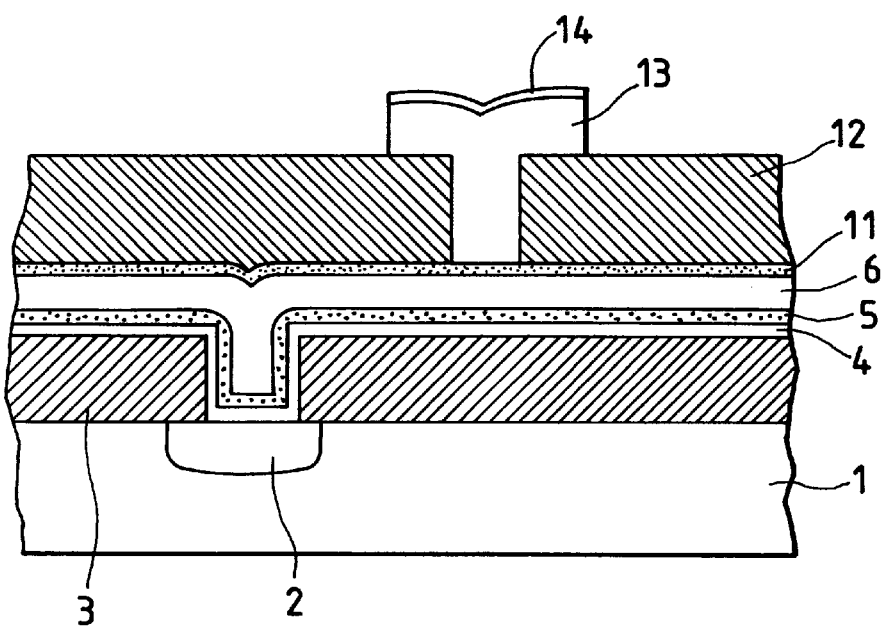
FIG. 2 is a conceptional view of a multi-layer wiring structure preferable for applying the present invention.

A multi-layer wiring structure to which the present invention can be applied is shown in FIG. 2. FIG. 2 cross-sectionally illustrates a semiconductor device in which the technique of the present invention is applied to contact holes and through holes.

In FIG. 2, reference numeral 11 denotes a reflection preventive layer formed on the surface of the first layer wiring layer, and is formed of TiN, TaN, Ta, Ti or the like.

Reference numeral 12 denotes an interlayer insulating layer, and may preferably be an interlayer insulating layer formed in, e.g., a sandwich structure comprised of phosphorus-doped SiO, an etched-back layer formed by SOG (spin-on-glass) process and phosphorus-doped SiO, a sandwich structure comprised of phosphorus-doped SiO, a TEOS (tetraethyl orthosilicate) type film and phosphorus-doped SiO or a sandwich structure comprised of phosphorus-doped SiO, an $O_3$-TEOS film and phosphorus-doped SiO, to have an overhung structure and a good step coverage.

On the interlayer insulating layer as described above, a wiring metal layer 13 is formed by the above first method or second method, and the reflection preventive layer 14 is formed as an upper layer thereof.

As shown in the present example, the second layer metal can be formed on a flat underlying insulating layer. This enables formation of a three-layer or four-layer multi-layer wiring without any complicated processing. Also, the contact holes and through holes are filled with Al type or Ca type metal, and hence these regions can be made to have a low resistance.

Semiconductor Device

An example of a semiconductor device that can be achieved for the first time when the technique of the present invention is introduced will be described below with reference to FIGS. 3, 4A, 4B, 4C and 4D.

Figure 3:
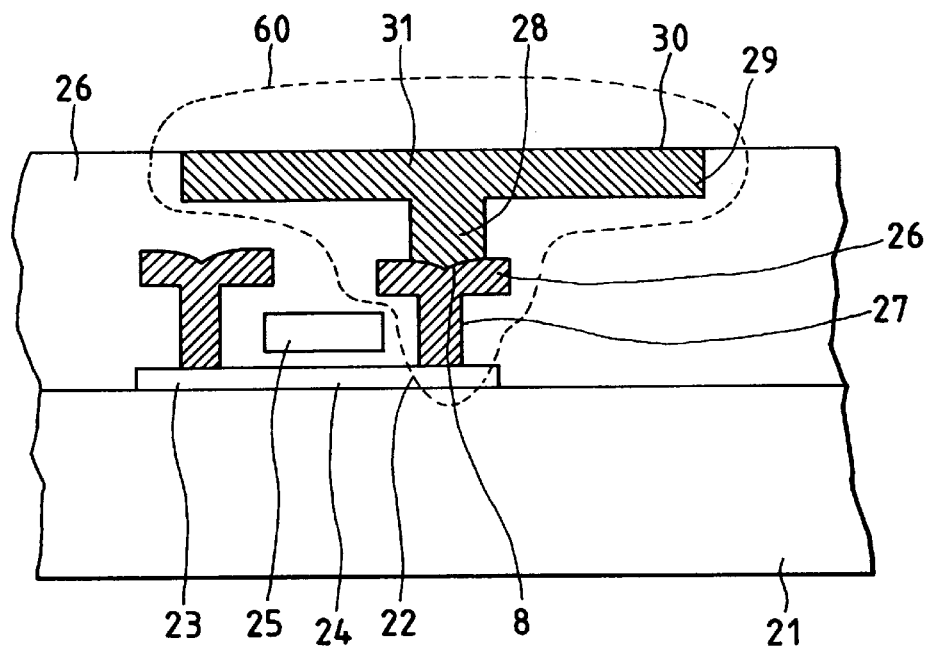
FIG. 3 is a cross-sectional structural view of a TFT preferable for applying the present invention.

FIG. 3 illustrates a cross-sectional structure of a reflection type display device making use of a TFT (thin-film transistor) driver. In FIG. 3, reference numeral 21 denotes a glass substrate; 22, a drain of the TFT; 23, a source of the TFT; 24, a channel of the TFT; 25, a gate of the TFT; 26, a first wiring layer connected to the source and drain; 27, a contact; 28, a through hole making connection between a second wiring layer 29 and the first wiring layer.

What should be noted in the present structure is the following two points.

(1) That the through hole 28 is provided on the contact 27. In usual instances, it is very difficult to form a through hole on the contact because a greatly stepped portion may appear on the contact after the first wiring layer is formed and hence no sufficient contact resistance can be obtained at the through hole to the second wiring layer or because there is a problem on reliability, and hence the through hole is formed at a region distant therefrom. Accordingly, when a highly integrated chip is formed in DRAM or the like, the size of the contact hole or through hole has been more contributory than the size of the transistor. Employment of the technique of the present invention has made it possible for the first time to form the through hole on the contact, because as denoted by reference numeral 8 the first wiring layer on the contact has a shape free of overhang and has a fairly flat structure. Thus, not only a highly integrated circuit can be formed but also, in liquid-crystal display devices or the like, wiring regions can be reduced, making it possible to achieve a higher opening percentage.

(2) What should be noted secondly is that as denoted by reference numeral 30 the surface level of the first wiring layer is in agreement with the surface level of the insulating layer and also, as denoted by reference numeral 31, the surface of the second wiring layer at the through hole is formed flat.

With achievement of the present structure, not only multi-layer wiring for, e.g., MPUs (microprocessor units) can be formed in a high reliability, but also a high reflectance can be achieved over the whole electrode surface in a display device in which an additional, second wiring layer 31 is formed as a light-reflecting electrode. Moreover, any particles on the electrode surface can be removed, and hence a semiconductor device with a higher reliability can be achieved.

How to fabricate such as structure will be described with reference to FIGS. 4A to 4D.

Figure 4A:
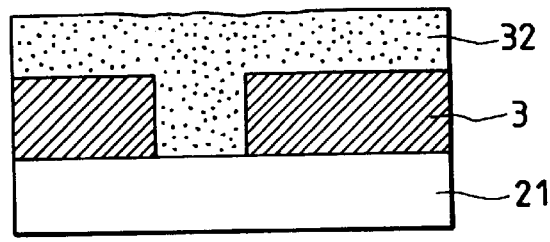
FIGS. 4A, 4B, 4C and 4D illustrate a process for forming TFT contacts preferable for applying the present invention.

FIG. 4A cross-sectionally illustrates a first wiring layer 32 formed on the contact. The first wiring layer 32 is a metal film superposingly formed of the three layers 4, 5 and 6 shown in FIG. 1. A reflection preventive layer may further be provided as its upper layer.

Figure 4B:
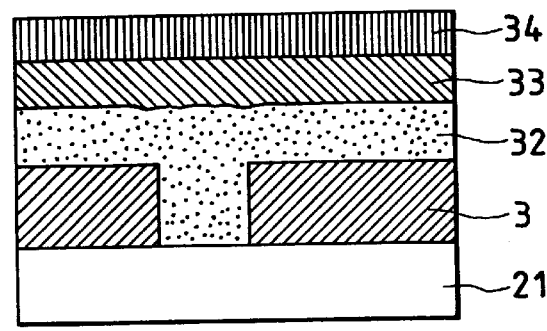

As shown in FIG. 4B, an $SiO_2$ type insulating layer 33 and an SiN type insulating layer 34 are formed on the first wiring layer 32. The insulating layer 33 corresponds to the insulating layer 12 shown in FIG. 2.

The layers 33 and 34 are not particularly limited to those having this structure so long as the selection ratio can be ensured for each layer at the time of etching. The both layers may be formed in reverse order.

Figure 4C:
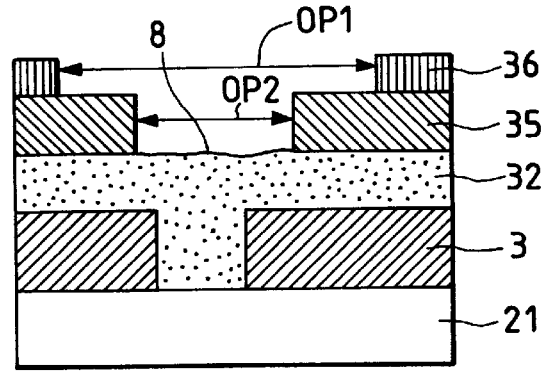

Next, as shown in FIG. 4C, the insulating layer 34 is first etched so as to form a large opening to form a stepped portion 36 that forms a first opening OP1, and then the insulating layer 33 is etched to form a stepped portion 35 that forms a second, small opening OP2. Here, as denoted by reference numeral 8, the first wiring layer 32 has a fairly flat surface, and hence no resist can remain in the region 8 when the stepped portion 35 is formed by etching.

Figure 4D:
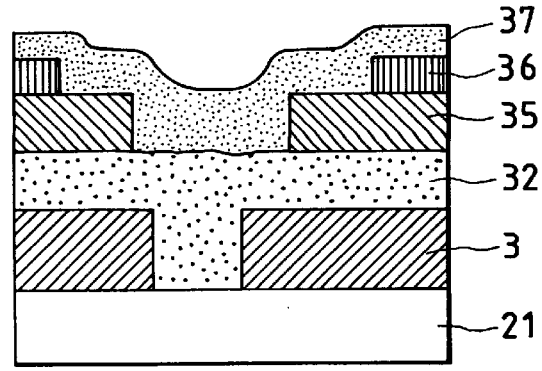

Next, as shown in FIG. 4D, the second wiring layer is formed using the technique of the present invention. The second wiring layer flows into the grooves of the stepped portions 35 and 36, so that as denoted by reference numeral 37, although slightly stepped because of the portions 35 and 36, a substantially flat second wiring layer can be formed.

This second wiring layer is subjected to CMP using a slurry containing an alkaline colloidal silica, followed by scrubbing and megasonic pure-water cleaning which are carried out in combination to obtain a structure corresponding to the part denoted by reference numeral 60 in FIG. 3.

When AlSi is used as the second wiring layer, the AlSi surface can have an optical reflectance as very high as 95% or higher.

When the second wiring layer is subjected to CMP, it becomes truely flat, and hence it does not occur that the slurry adheres to the grooves and cannot be removed by cleaning. This also brings about an advantage that, even when the second wiring layer comes into contact with any liquid-crystal layer, no impurities mix into the liquid-crystal layer and no burning occurs.

Liquid-crystal Display Device

Figure 5:
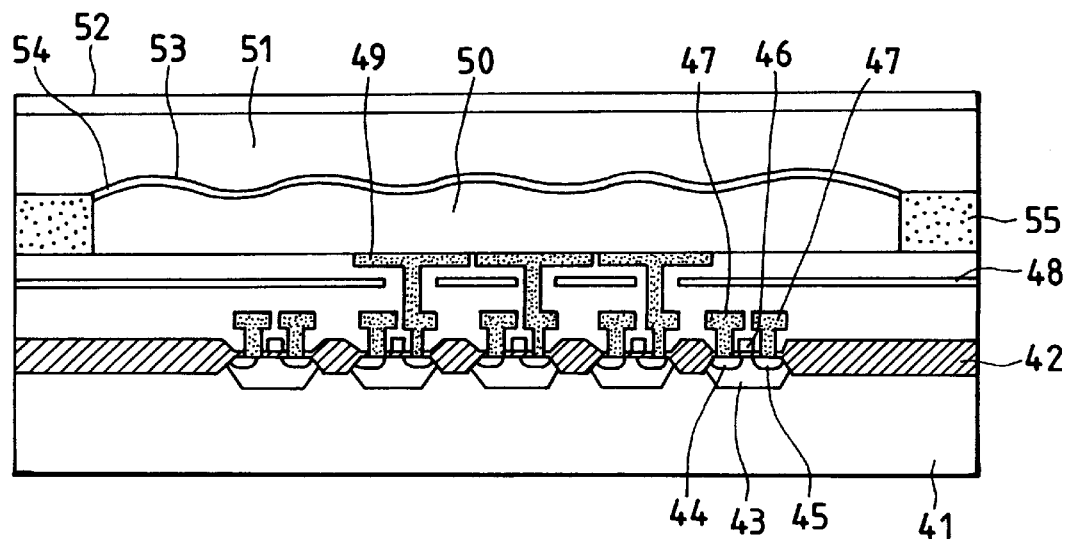
FIG. 5 is a cross-sectional structural view of a liquid-crystal display device preferable for applying the present invention.

Another embodiment will be described with reference to FIG. 5. FIG. 5 illustrates a cross-sectional structure of a liquid-crystal display device in which the structure shown in FIG. 3 is applied.

In FIG. 5, reference numeral 41 denotes an Si substrate; 42, an LOCOS insulating layer; 43, a well layer; 44 and 45, a source and a drain, respectively, of an MOSFET (metal-oxide-semiconductor field-effect transistor; 46, a gate electrode of the MOSFET; 47, a first wiring layer connected to the source, the drain and so forth; 48, a layer formed of Ti or the like; 49, a wiring layer serving as each picture element electrode; and 50, a PDLC, PNLC or guest-host type liquid crystal, any of which may be used so long as it is applicable to the reflection type device.

Reference numeral 51 denotes an opposing substrate; and 52, a reflection preventive layer provided on the opposing substrate. The opposing substrate 51, on its side coming into contact with the liquid crystal, is worked so as to have angles different from the reflecting electrode 49 as denoted by reference numeral 53, and has a transparent electrode on its surface as denoted by reference numeral 54. Reference numeral 55 denotes a sealing material that forms a gap between the opposing substrate and the Si substrate.

In the device shown in FIG. 5, signals are written and stored in the reflecting electrode by the use of the MOSFET formed on the Si wafer, or may be done by the use of the TFT formed on a glass substrate as shown in FIG. 3.

What is shown in FIG. 5 is an example of a display device making use of liquid crystal. The present invention may also be employed in a display device in which the reflecting electrode 49 has such a structure that it is secured by a hinge and the electrode is inclined by an electric field, or a display device in which a bimetal material is provided beneath the electrode and the electrode is inclined to make display by applying a voltage to the bimetal material.

EXAMPLES

Example 1

In the present Example, the semiconductor device having the structure as shown in FIG. 1 was fabricated.

The p-type well region 1 was formed on the surface of an n-type Si substrate, and the $n^+$-type high-density impurity region 2 was formed in the p-type well region 1 by ion implantation.

Thereafter, the BPSG film 3 was formed in a thickness of 700 nm, and the BPSG film 3 was reflowed at 950° C. to smooth its surface. Then, a resist was coated thereon, followed by photolithography to form contact holes of 0.5 μm diameter at the contacts 7 by RIE.

After the resist was stripped off, the surface was washed with diluted hydrofluoric acid and then rinsed with pure water containing low-dissolved oxygen, followed by drying.

Subsequently, the wafer thus processed was introduced into the barrier metal film-forming chamber of the apparatus shown in FIG. 6, where the Ti thin film was formed by sputtering in a thickness of about 30 nm and then the TiN thin film was formed similarly in a thickness of 150 nm. After the TiN thin film was formed, the wafer thus processed was taken out of the apparatus and was set open to the atmosphere to effect oxidation between columnar crystals of TiN.

Next, the resulting wafer was again put into the load lock chamber. When the wafer was put into it, the inside of the load lock chamber was kept at a positive pressure and was evacuated while being purged with high-purity $N_2$ (containing not more than 10 ppb of impurities such as water content). The side walls of the load lock chamber were also heated to a high temperature to prevent the water content from adhering.

After the wafer thus processed was put into the load lock chamber, its inside was evacuated to a vacuum state at a level of $10^{-9}$ Torr, and subsequently put into the wiring film-forming chamber. After the wafer was put into the wiring film-forming chamber, the TiN layer surface was irradiated with ions at an energy of about 5 eV to clean the surface.

After the water content and so forth were removed from the surface by cleaning the surface, the wiring layer was formed using an AlSi target in an atmosphere of Ar.

The base pressure at the time of film formation was $10^{-10}$ Torr to provide an ultra-high vacuum state so that the formation of an oxide layer on the surface of the film formed little took place.

At this stage, the voids as shown in FIG. 8 were seen on the surface.

Next, after the wiring layer was formed in the wiring film-forming chamber, the wafer thus processed was moved to the reflow chamber through the load lock chamber and, after the background pressure was set to $10^{-7}$ Torr by means of a turbo-molecular pump, the wafer was heated at a temperature region of 430° C. in an atmosphere of Ar+1%$H_2$.

As the result, as denoted by reference numeral 8 in FIG. 1, the wiring material flowed into the contact holes to provide a good flatness.

Example 2

In the present Example, the $H_2$ used in Example 1 was replaced with hydrogen radicals, which were used in a content of 0.1%.

The procedure of Example 1 was repeated except that the Ni tube connected to the reflow chamber was heated to 500° C., and hydrogen gas was flowed through it to thereby generate hydrogen radicals to introduce them into the reflow chamber.

Like Example 1, a good flatness was obtained also in the present Example.

Example 3

In the present Example, the second method previously described was used as the method of incorporating hydrogen.

The apparatus used has the double processing chamber constitution as shown in FIG. 7, having the load lock chamber.

First, a barrier metal Ti layer was formed in the same manner as in Example 1.

After the barrier metal layer was formed, the wafer was loaded in the chamber for forming the wiring metal film, and discharge was conducted in an Ar atmosphere to which hydrogen was added to carry out sputtering. Hydrogen was added in an amount of 8%.

As the gas used here, a gas obtained by adding 0.1 to 10% of $H_2$ to Ar to make up plasma or a gas obtained by adding 0.1 to 10% of $H_2$ to Xe to make up a plasma atmosphere may be used, and films may be formed in such an atmosphere.

Since the sputtering was carried out in an atmosphere containing hydrogen, not a cryopump but a turbo-molecular pump was used.

Measurement by SIMS (secondary ion mass spectroscopy) revealed that a very small quantity of hydrogen was incorporated in the wiring layer formed by this method, which was formed in an atmosphere containing $H_2$. The incorporation of H also brought about an improvement in crystallizability, so that no hillocks occurred when heated at 300° C. in the atmosphere after the film formation. This method enabled both film formation and reflowing in the same process and made the process simpler, bringing about a great improvement in yield and cost.

Example 4

A fourth example will be described below with reference to FIG. 2.

The device shown in FIG. 2 is a semiconductor device in which wiring is further formed via through holes on the structure of FIG. 1 to provide a multi-layer wiring structure.

The wiring layer 6 was formed in the same manner as in Example 1. Thereafter, the reflection preventive layer 11 comprised of TiN was formed on the wiring surface.

The interlayer insulating layer 12 was further formed, followed by RIE and photolithography to form through holes of 0.5 µm diameter.

Next, the wafer thus processed was put into the load lock chamber of the apparatus as shown in FIG. 7. When the wafer was put into it, the inside of the load lock chamber was kept at a positive pressure and was evacuated while being purged with high-purity $N_2$ (containing not more than 10 ppb of impurities such as water content). The side walls of the load lock chamber were also heated to a high temperature to prevent the water content from adhering.

After the wafer thus processed was put into the load lock chamber, its inside was evacuated to a vacuum state at a level of $10^{-9}$ Torr, and subsequently put into the wiring film-forming chamber. After the wafer was put into the wiring film-forming chamber, the layer surface was irradiated with ions at an energy of about 5 eV to clean the surface.

After the water content and so forth were removed from the surface by cleaning the surface, the wiring layer was formed using a Cu target in an atmosphere of Ar.

The base pressure at the time of film formation was $10^{-10}$ Torr to provide an ultra-high vacuum state so that the formation of an oxide layer on the surface of the film formed little took place.

At this stage, voids were seen on the surface.

Next, the wafer thus processed was moved to the reflow chamber through the load lock chamber and, after the background pressure was set to $10^{-7}$ Torr by means of a turbo-molecular pump, the wafer was heated at a temperature region of 450° C. in an atmosphere of Ar+10%$H_2$.

As the result, the wiring material flowed into the contact holes to provide a good flatness.

According to the present invention, a structure having a low resistance and a flatness can be achieved in a simpler manner and a good yield even when the device originally has greatly stepped portions such as contact holes or through holes.

Example 5

On an Si wafer as a semiconductor substrate, a BPSG film as an insulating layer was formed in a thickness of 700 nm, followed by reflowing at 95° C.

In the BPSG film, contact holes of 0.5 µm diameter were formed by photolithography.

On the surface of the BPSG film having the contact holes, i.e., the stepped portions, and on the side walls and bottoms in the contact holes, a Ti film was formed in a thickness of 30 nm by sputtering, and thereafter a TiN film was formed thereon by reactive sputtering.

Subsequently, using an aluminum target containing Ge, sputtering was carried out in an atmosphere of Ar to form an Al—Ge film in a thickness of 800 to 900 nm, followed by heating in an atmosphere of hydrogen to effect reflowing. Thereafter, according to the procedure as shown in FIGS. 4A to 4D, a film 37 comprised of Al—Ge was formed. Then, the film formed was similarly heated in an atmosphere of hydrogen to effect reflowing.

Next, the substrate thus processed was set on a chemical mechanical polishing (CMP) apparatus to carry out polishing until the underlying insulating layer 36 became partly laid bare.

According to the present Example, the Al film containing hydrogen and germanium at least at its surface was formed. Hence, a metal film having a high reflectance and a flat shape was obtained upon CMP and also the slurry used in CMP was also removed with ease.

What is claimed is:

1. A process for forming on a surface having a stepped portion of a substrate a metal film to form a wiring, comprising:

a deposition step of depositing a metal film on the substrate having the stepped portion by sputtering; and a heat treatment step of heat treating the substrate having the metal film deposited at a temperature of from 150° C. to 450° C. in an atmosphere containing at least one selected from the group consisting of hydrogen gas, radical hydrogen and plasma hydrogen, without exposure to the atmosphere, for reflowing the deposited metal film.

2. The process according to claim 1, wherein the stepped portion includes a hole provided in an insulating film.

3. The process according to claim 1, wherein the metal film contains Ge and at least one of Al and Cu.

4. The process according to claim 3, wherein the content of Ge is 0.2% to 5% by weight.

5. The process according to claim 1, further comprising, before the deposition step, the step of forming a film containing titanium on the surface of the substrate having the stepped portion.

6. The process according to claim 1, further comprising, before the deposition step, the step of forming a film containing titanium and nitrogen on the surface of the substrate having the stepped portion.

7. The process according to claim 1, wherein the pressure during the heat treatment step is $10^{-7}$ Torr or less.

8. The process according to claim 1, further comprising, after the heat treatment step, a polishing step of polishing the surface of the metal film until a surface of an insulating film lying beneath the metal film is partly exposed.

9. The process according to claim 1, comprising using an apparatus having a barrier metal forming chamber, a deposition chamber for depositing the metal film and a heat treatment chamber for carrying out the heat treatment connected to one another via a load lock chamber, wherein, after a barrier metal is formed on the surface having the stepped portion of the substrate, the deposition and the heat treatment steps are carried out.

10. The process according to claim 1, wherein the stepped portion forms a contact hole, and further comprising the steps of:

forming an insulating film on the metal film;

forming a through-hole in the insulating film on the contact hole; and depositing a metal in the through-hole.

11. A process for forming a metal film on a substrate surface to form a wiring, comprising:

forming a stepped portion on the surface of the substrate; and depositing a metal film on the stepped portion of the substrate by sputtering in an atmosphere containing at least one selected from the group consisting of hydrogen gas, radical hydrogen and plasma hydrogen.

12. The process according to claim 11, wherein the atmosphere is established by supplying a reaction chamber with hydrogen gas at a flow rate ratio of from 0.1% to 10% based on another gas.

13. The process according to claim 11, wherein the stepped portion is formed by removing a portion of an insulating film.

14. The process according to claim 11, wherein the metal film contains Ge and at least one of Al and Cu.

15. The process according to claim 14, wherein the content of Ge is approximately 0.2% to 5% by weight.

16. The process according to claim 11, further comprising:

forming a film containing titanium on the stepped portion of the substrate prior to the deposition step.

17. The process according to claim 11, further comprising:

forming a film containing titanium and nitrogen on the stepped portion of the substrate prior to the deposition step.

18. The process according to claim 11, wherein the pressure during the heat treatment step is $10^{-7}$ Torr or less.

19. The process according to claim 11, further comprising:

a polishing step for polishing the surface of the metal film until a surface of an insulating film lying beneath the metal film is partially exposed.

20. The process according to claim 11, wherein the metal film is deposited using an apparatus having a barrier metal forming chamber and a deposition chamber connected to one another via a load lock chamber, wherein, after a barrier metal is formed on the stepped surface of the substrate, the deposition step is carried out.

21. The process according to claim 11, wherein the stepped portion forms a contact hole, and further comprising:

forming an insulating film on the metal film;

forming a through-hole in the insulating film on the contact hole; and depositing a metal in the through-hole.

* * * * *